United States Patent
Hong

(10) Patent No.: US 10,910,065 B2
(45) Date of Patent: Feb. 2, 2021

(54) MEMORY SYSTEM AND OPERATING METHOD THEREOF

(71) Applicant: SK hynix Inc., Gyeonggi-do (KR)

(72) Inventor: Jiman Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 79 days.

(21) Appl. No.: 16/201,280

(22) Filed: Nov. 27, 2018

(65) Prior Publication Data

US 2019/0325969 A1 Oct. 24, 2019

(30) Foreign Application Priority Data

Apr. 20, 2018 (KR) .................. 10-2018-0046177

(51) Int. Cl.
*G11C 11/00* (2006.01)
*G11C 16/26* (2006.01)
(Continued)

(52) U.S. Cl.
CPC .......... *G11C 16/26* (2013.01); *G06F 11/1068* (2013.01); *G11C 16/10* (2013.01);
(Continued)

(58) Field of Classification Search
None
See application file for complete search history.

(56) References Cited

U.S. PATENT DOCUMENTS

| 2013/0016562 A1* | 1/2013 | Mun | G11C 11/5628 |
| | | | 365/185.12 |
| 2014/0101519 A1* | 4/2014 | Lee | G06F 11/1068 |
| | | | 714/773 |

(Continued)

FOREIGN PATENT DOCUMENTS

| KR | 100895065 | 5/2009 |
| KR | 101094605 | 12/2011 |
| KR | 1020130008302 | 1/2013 |

OTHER PUBLICATIONS

Y. Cai, Y. Luo, S. Ghose and O. Mutlu, "Read Disturb Errors in MLC NAND Flash Memory: Characterization, Mitigation, and Recovery," 2015 45th Annual IEEE/IFIP International Conference on Dependable Systems and Networks, Rio de Janeiro, 2015, pp. 438-449, doi: 10.1109/DSN.2015.49. (Year: 2015).*

*Primary Examiner* — Daniel F. McMahon
(74) *Attorney, Agent, or Firm* — IP & T Group LLP

(57) ABSTRACT

A memory system includes a memory device configured to store data, and read and output the stored data in a read operation, and a memory controller configured to perform an error correction operation on the data received from the memory device in the read operation and control the memory device to perform a read retry operation, based on the result of the error correction operation. The memory device outputs the data read in the read retry operation to the memory controller when the number of specific data, among data read in the read retry operation, is in a set range. Only reliability-ensured data in the read retry operation is output to the memory controller. Thus, the number of times of outputting data to the memory controller can be decreased, and the number of times where the memory controller performs an error correction operation can be decreased.

19 Claims, 9 Drawing Sheets

(51) Int. Cl.
  *G11C 16/10*  (2006.01)
  *G11C 29/52*  (2006.01)
  *G06F 11/10*  (2006.01)
  *G11C 11/56*  (2006.01)

(52) U.S. Cl.
  CPC .......... *G11C 29/52* (2013.01); *G11C 11/5628* (2013.01); *G11C 11/5642* (2013.01)

(56) References Cited

U.S. PATENT DOCUMENTS

| | | | |
|---|---|---|---|
| 2016/0027485 A1* | 1/2016 | Park | G11C 7/062 |
| | | | 365/191 |
| 2016/0357472 A1* | 12/2016 | Choi | G06F 11/0754 |
| 2018/0113758 A1* | 4/2018 | Choo | G11C 29/52 |
| 2018/0158493 A1* | 6/2018 | Ryu | G11C 7/1006 |
| 2019/0050286 A1* | 2/2019 | Lee | G11C 29/021 |

* cited by examiner

MEMORY SYSTEM AND OPERATING METHOD THEREOF

CROSS-REFERENCE TO RELATED APPLICATION

The present application claims priority under 35 U.S.C. § 119(a) to Korean patent application number 10-2018-0046177, filed on Apr. 20, 2018, which is incorporated herein by reference in its entirety

BACKGROUND

Field of Invention

The present disclosure generally relates to an electronic device, and more particularly, to a memory system and an operating method thereof.

Description of Related Art

The paradigm on recent computer environment has shifted to a ubiquitous computing environment in which computing systems can be used anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

Such a data storage device has excellent stability and durability, high information access speed, and low power consumption, since there is no mechanical driving part. In exemplary memory systems having such advantages, the data storage device includes a universal serial bus (USB) memory device, memory cards having various interfaces, a solid state drive (SSD), and the like.

SUMMARY

Embodiments provide a memory system for outputting, to a memory controller, only data of which reliability is ensured in a read retry operation of the memory system, and an operating method of the memory system.

In accordance with an aspect of the present disclosure, there is provided a memory system including: a memory device configured to store data, and read and output the stored data in a read operation; and a memory controller configured to perform an error correction operation on the data received from the memory device in the read operation and control the memory device to perform a read retry operation, based on the result of the error correction operation, wherein the memory device outputs the data in the read retry operation to the memory controller when the number of specific data, among data read in the read retry operation, is in a set range.

In accordance with another aspect of the present disclosure, there is provided a memory system including: a memory device configured to store data, and read and output the stored data in a read operation; and a memory controller configured to perform an error correction operation on the data received from the memory device in the read operation and control the memory device to perform a read retry operation, based on the result of the error correction operation, wherein, when the number of specific data, among data read in the read retry operation, is out of a set range, the memory device re-performs the read retry operation without outputting the data read in the read retry operation to the memory controller.

In accordance with still another aspect of the present disclosure, there is provided a method for operating a memory system, the method including: reading data stored in a memory device by performing a read operation using a read voltage; performing an error correction operation by transmitting the read data to the memory controller; when it is determined that the error correction operation has failed, performing a read retry operation using a new read voltage; determining whether the number of specific data among the data read in the read retry operation is in a set range; and performing the error correction operation by transmitting the data read in the read retry operation to the memory controller, when the number of the specific data is in the set range.

In accordance with another aspect of the present disclosure, there is provided a memory system including: a memory device; and a memory controller configured to control the memory device to perform one or more read retry operations, wherein the memory device: determines whether data read in accordance with each read retry operation are reliable; transmits the data read in a first read retry operation to the memory controller, when it is determined that the data read in the first read retry operation is reliable; and performs a second read retry operation based on a new read retry voltage, different from a read retry voltage used in the first read retry operation, without transmitting the data read in the first read retry operation to the memory controller, when it is determined that the data read in the first read retry operation is unreliable.

BRIEF DESCRIPTION OF THE DRAWINGS

Various embodiments will now be described more fully with reference to the accompanying drawings; however, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. Also, throughout the specification, reference to "an embodiment" or the like is not necessarily to only one embodiment, and different references to any such phrase are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
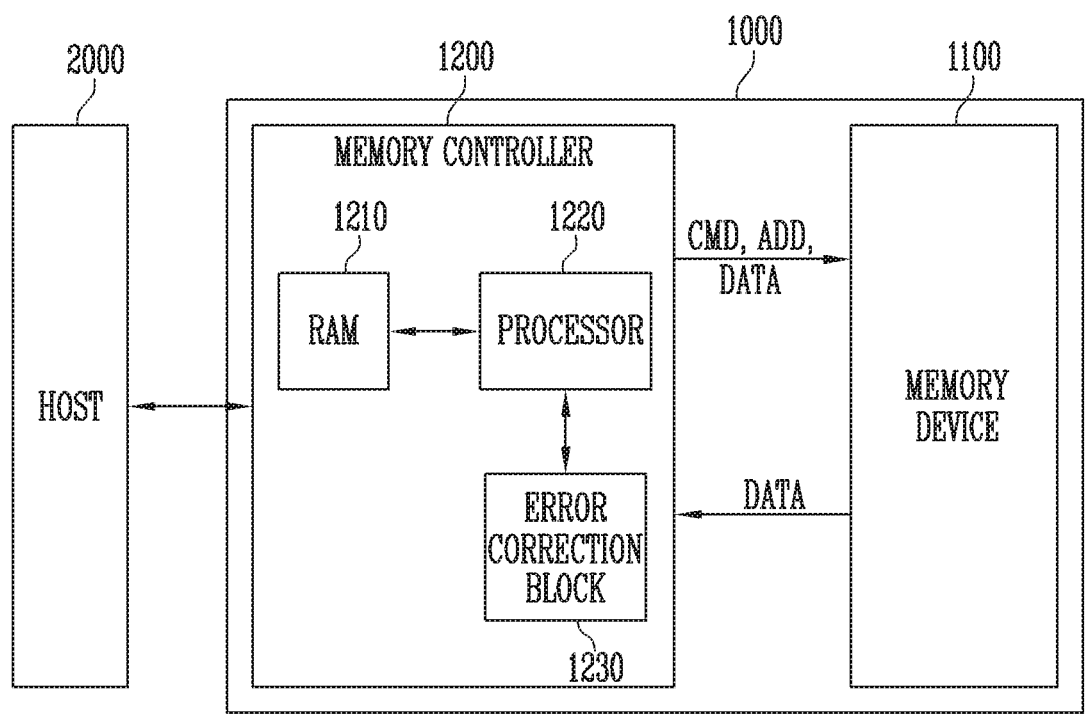
FIG. 1 is a block diagram illustrating a memory system in accordance with an embodiment of the present disclosure.

The specific structural and functional description disclosed herein is for the purpose of describing embodiments of the present invention. The embodiments can be modified and implemented in different ways, and thus the present invention is not limited to the embodiments set forth herein.

Various embodiments are illustrated in the drawings and described herein in detail. However, the present invention is not limited to the specifics disclosed, and instead includes all changes, equivalents, or substitutes that do not depart from the spirit and technical scope of the present disclosure.

While terms such as "first" and "second" may be used to identify various components, such components are not limited by the above terms. Rather, such terms are used only to distinguish one component from another that otherwise have the same or similar names. For example, a first component in one instance may be referred to as a second component in another instance and vice versa without departing from the scope of rights of the present disclosure.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Similarly, communication between two elements may be direct or indirect, and in either case, wired or wireless, unless the context indicates otherwise. Other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms and vice versa, unless the context clearly indicates otherwise. It will be further understood that terms such as "including" or "having," etc., are intended to indicate the existence of stated features, numbers, operations, actions, components, parts, or combinations thereof but are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing embodiments, description of techniques that are well known to the art to which the present disclosure pertains and not directly related to the present disclosure is omitted. This is done so as not to unnecessarily obscure the present invention.

Various embodiments of the present disclosure will be described in detail with reference to the accompanying drawings in order for those skilled in the art to be able to readily practice the present invention.

FIG. 1 is a block diagram illustrating a memory system 1000 in accordance with an embodiment of the present disclosure.

Referring to FIG. 1, the memory system 1000 may include a memory device 1100 for storing data and a memory controller 1200 for controlling the memory device 1100 under the control of a host 2000.

The host 2000 may communicate with the memory system 1000 by using an interface protocol such as peripheral component interconnect express (PCI-e or PCIe), advanced technology attachment (ATA), serial ATA (SATA), parallel ATA (PATA), or serial attached SCSI (SAS). However, the interface protocol between the host 2000 and the memory system 1000 is not limited to the above-described examples; one of other interface protocols such as a universal serial bus (USB), a multi-media card (MMC), an enhanced small disk interface (ESDI), and integrated drive electronics (IDE) may be used instead.

The memory device 1100 operates under the control of the memory controller 1200. In an embodiment, the memory device 1100 may be a flash memory device. The memory device 1100 may include a memory cell array having a plurality of memory blocks.

The memory device 1100 receives a command CMD and an address ADD from the memory controller 1200 through a channel, and accesses an area in the memory cell array, which is selected by the address ADD. That is, the memory device 1100 performs an internal operation corresponding to the command CMD on the area selected by the address ADD. For example, the memory device 1100 performs a program operation on a selected memory block in response to a command CMD, an address ADD, and data DATA, which correspond to the program operation. Also, the memory device 1100 performs a read operation on the selected memory block in response to a command CMD and an address ADD, which correspond to the read operation, and read data DATA may be output to the memory controller 1200.

The memory controller 1200 may control overall operations of the memory system 1000, and control data exchange between the host 2000 and the memory device 1100. For example, the memory controller 1200 may control the memory device 1100 in response to a request from the host 2000 to program or read data or erase the programmed data. For example, the memory controller 1200 may output, to the memory device 1100, a command CMD, an address ADD, and data DATA, which correspond to each of the overall operations, in response to a request from the host 2000. The memory controller 1200 may receive data DATA from the memory device 1100 and output the received data DATA to the host 2000.

The memory controller 1200 may include a random access memory (RAM) 1210, a processor 1220, and an error correction block 1230.

The RAM 1210 operates under the control of the processor 1220. The RAM 1210 may be used as a working memory, cache memory or buffer memory of the processor 1220. The RAM 1210 may store codes and commands, which are executed by the processor 1220. The RAM 1210 may store data processed by the processor 1220. The RAM 1210 may be a static RAM (SRAM) or a dynamic RAM (DRAM).

The processor 1220 is configured to control read, program, erase, and background operations of the memory device 1100. The processor 1220 is configured to drive firmware for controlling the memory device 1100.

When a request corresponding to a program operation is received from the host 2000, the processor 1220 may randomize data DATA received from the host 2000 and output the data DATA to the memory device 1100. When the memory device 1100 is programmed using a multi-level cell (MLC) scheme, the processor 1220 randomizes data DATA received from the host 2000 and converts the data DATA into random data in which first to fourth data 00, 01, 10, and 11, each having the same number. When the memory device 1100 is programmed using a triple-level cell (TLC) scheme, the processor 1220 randomizes data DATA received from the host 2000 and converts the data DATA into random data in which first to eighth data 000, 001, 010, 011, 100, 101, 110, and 111 each have an equal number. Therefore, the memory device 1100 is programmed using a plurality of data sequences, each having an equal number.

When a request corresponding to a read operation is received from the host 2000, the processor 1220 generates a command CMD corresponding to the read operation and provides the command CMD to the memory device 1100. The processor 1220 translates a logical block address included in the request corresponding to the read operation into a physical block address. In an embodiment, the processor 1220 serves as a flash translation layer (FTL). The processor 1220 may provide, to the memory device 1100, the translated address ADD together with the command CMD corresponding to the read operation.

The error correction block 1230 may correct an error by decoding data DATA received from the memory device 1100 according to an error correction code. Various schemes may be used for the error correction code. For example, there may be used error correction codes using various schemes such as Bose, Chaudhuri, and Hocquenghem (BCH) code, Reed-Solomon (RS) code, Hamming code, and low density parity check (LDDC) code. An error correction function performed by the error correction block 1230 is limited according to the number of error bits in the data DATA received from the memory device 1100. When the number of error bits in the data DATA received from the memory device 1100 is less than a specific value, the error correction block 1230 performs an error detection and correction function.

When the number of error bits in the data DATA received from the memory device 1100 is greater than the specific value, the error detection and correction function may not be performed, and the read operation of the memory device 1100 may fail. When the number of error bits in the data DATA received from the memory device 1100 is greater than the specific value, the processor 1220 may control the memory device 1100 to re-perform the read operation by changing a read voltage. This is referred to as a read retry operation, and a read retry table including an offset voltage may be referred to change the read voltage in the read retry operation. The read retry table may be stored in the RAM 1210. Specifically, the memory device 1100 may change the read voltage, based on the offset voltage included in the read retry table, and re-perform the read operation, using the changed read voltage.

When the number of specific data (e.g., first data) among first and second data read using a new read voltage in the read retry operation is included in a set range (e.g., a range in which the number of specific data is 40% to 60% of the number of all data), the memory device 1100 determines that the reliability of the read data has been ensured, and outputs the data read in the read retry operation to the memory controller 1200. On the other hand, when it is determined that the number of specific data is out of the set range, the memory device 1100 determines that the reliability of the read data has not been ensured, and re-performs the read operation, using a new read voltage, without outputting the data to the memory controller 1200. The set range may be changed depending on states and situations of the memory device 1100.

Figure 2:
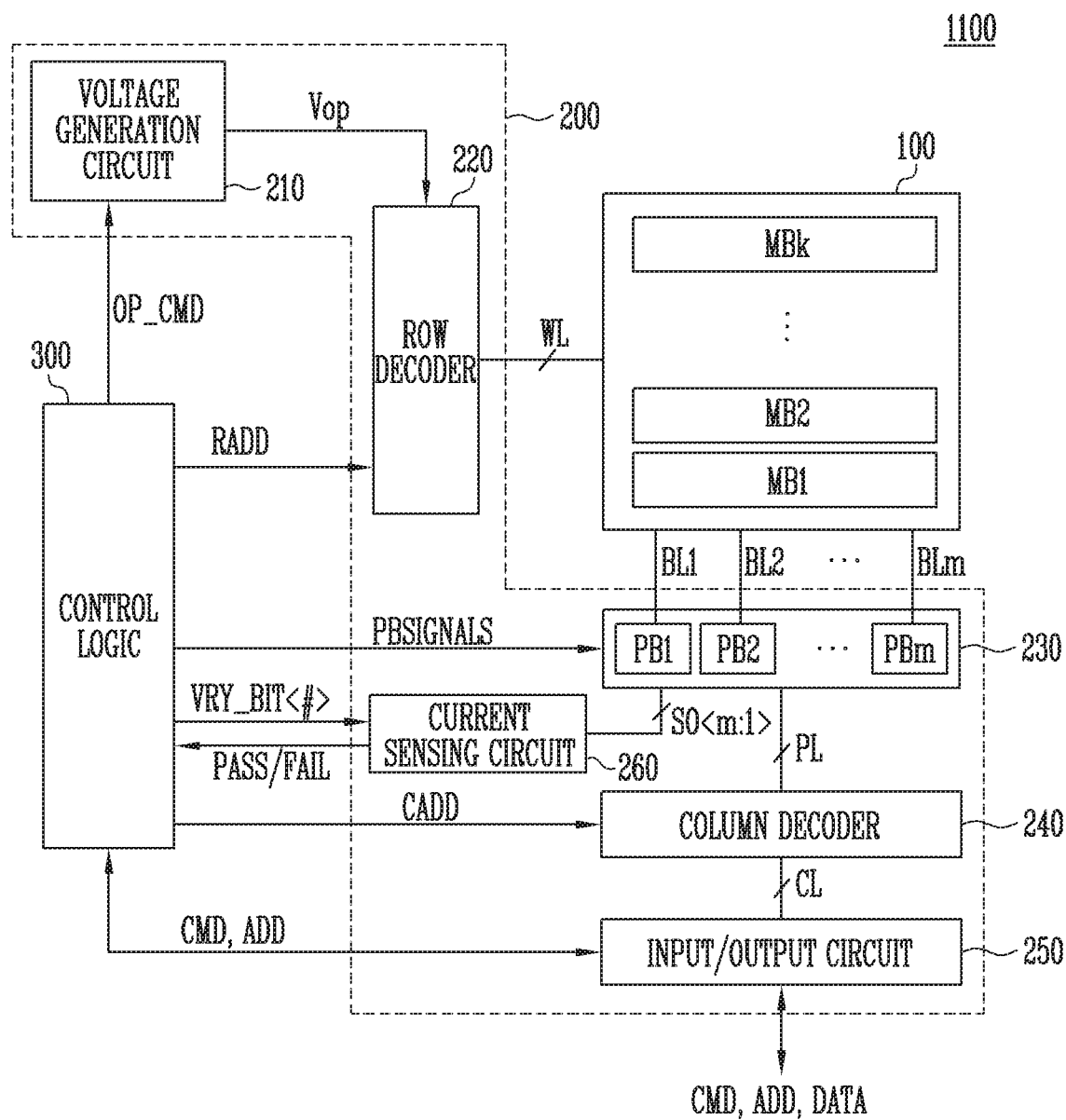
FIG. 2 is a block diagram illustrating a memory device in accordance with an embodiment of the present disclosure.

FIG. 2 is a block diagram illustrating a memory device in accordance with an embodiment of the present disclosure, for example, the memory device 1100 of FIG. 1.

Referring to FIG. 2, the memory device 1100 may include a memory cell array 100 for storing data, a peripheral circuit 200 configured to perform a program operation for storing data in the memory cell array 100, a read operation for outputting the stored data, and an erase operation for erasing the stored data, and a control logic 300 for controlling the peripheral circuit 200.

The memory cell array 100 may include a plurality of memory blocks MB1 to MBk (where k is a positive integer). Word lines WL and bit lines BL1 to BLm (where m is a positive integer) may be coupled to the memory blocks MB1 to MBk. Word lines WL may be coupled to each of the memory blocks, and bit lines BL1 to BLm may be commonly coupled to the memory blocks. Although not shown in FIG. 2, source select lines, drain select lines or pipe lines may be coupled to the memory blocks MB1 to MBk, in addition to the word lines WL.

The peripheral circuit 200 may include a voltage generation circuit 210, a row decoder 220, a page buffer group 230, a column decoder 240, an input/output circuit 250, and a current sensing circuit 260.

The voltage generation circuit 210 may generate various operating voltages Vop used for program, read, and erase operations in response to an operation signal OP_CMD. For example, the voltage generation circuit 210 may generate a program voltage, a read voltage, an erase voltage, a pass voltage, a turn-on voltage, and the like.

The row decoder 220 may transfer the operation voltages Vop to word lines WL coupled to a selected memory block in response to a row address RADD. Although not shown in FIG. 2, the row decoder 220 may transfer the operation voltages Vop to the source select lines, the drain select lines or the pipe lines.

The page buffer group 230 may include a plurality of page buffers PB1 to PBm coupled to the bit lines BL1 to BLm. The page buffers PB1 to PBm may operate in response to page buffer control signals PBSIGNALS. In a program operation, the page buffers PB1 to PBm may temporarily store data received through column lines CL and page lines PL, and adjust potential levels of the bit lines BL1 to BLm according to the temporarily stored data. In a read or verify operation, the page buffers PB1 to PBm may sense voltages or currents of the bit lines BL1 to BLm. The verify operation may include verify operations performed in program and erase operations.

The column decoder 240 may transfer data between the input/output circuit 250 and the page buffer group 230 in response to a column address CADD. For example, the column decoder 240 may exchange data with the page buffers PB through the page lines PL, or exchange data with the input/output circuit 250 through the column lines CL.

The input/output circuit 250 may transfer a command CMD and an address ADD, which are received from the memory controller 1200 of FIG. 1, to the control logic 300, or exchange data DATA with the column decoder 240.

In a read operation or a verify operation, the current sensing circuit 260 may generate a reference current in response to an allow bit VRY_BIT<#>, and output a pass signal PASS or a fail signal FAIL by comparing sensing currents corresponding to potential levels of sensing nodes SO<m:1> of the page buffers PB1 to PBm included in the page buffer group 230 with the reference current. In particular, the current sensing circuit 260 may output the pass signal PASS or the fail signal FAIL by determining whether the number of specific data among data sensed by the page buffer group 230 is included in a set range or not so as to determine the reliability of data read in a read retry operation. When the number of specific data is included in the set range, the current sensing circuit 260 may generate and output the pass signal PASS. When the number of specific data is out of the set range, the current sensing circuit 260 may generate and output the fail signal FAIL.

The control logic 300 may control the peripheral circuit 200 by outputting the operation signal OP_CMD, the row address RADD, the page buffer control signals PBSIGNALS, and the allow bit VRY_BIT<#> in response to the command CMD and the address ADD. In particular, the control logic 300 may determine the reliability of data sensed by the page buffer group 230 in response to the pass or fail signal PASS or FAIL in the read retry operation. When the pass signal PASS is received from the current sensing circuit 260, the control logic 300 determines that the reliability of the data sensed by the page buffer group 230 has been ensured, and controls the peripheral circuit 200 to output the sensed data to the memory controller 1200 of FIG. 1. When the fail signal FAIL is received from the current sensing circuit 260, the control logic 300 determines that the reliability of the data sensed by the page buffer group 230 has not been ensured, and controls the peripheral circuit 200 to re-perform the read retry operation, using a new read voltage, without outputting the sensed data to the memory controller 1200 of FIG. 1.

Figure 3:
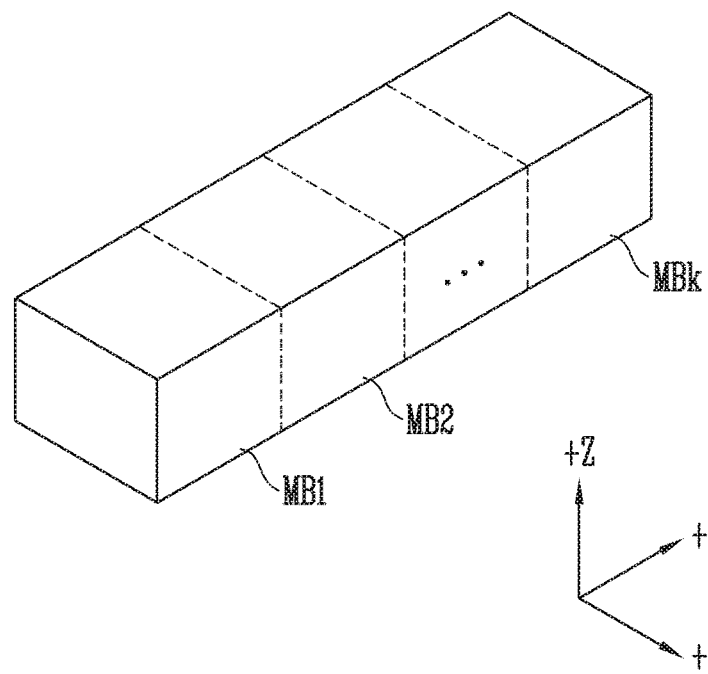
FIG. 3 is a block diagram illustrating a memory cell array in accordance with an embodiment of the present disclosure.

FIG. 3 is a block diagram illustrating a memory cell array in accordance with an embodiment of the present disclosure, for example, the memory cell array 100 of FIG. 2.

Referring to FIG. 3, the memory cell array 100 includes a plurality of memory blocks MB1 to MBk. Each memory block has a three-dimensional structure. Each memory block includes a plurality of memory cells stacked above a substrate. The plurality of memory cells are arranged along +X, +Y, and +Z directions. The structure of each memory block will be described in more detail with reference to FIG. 4.

Figure 4:
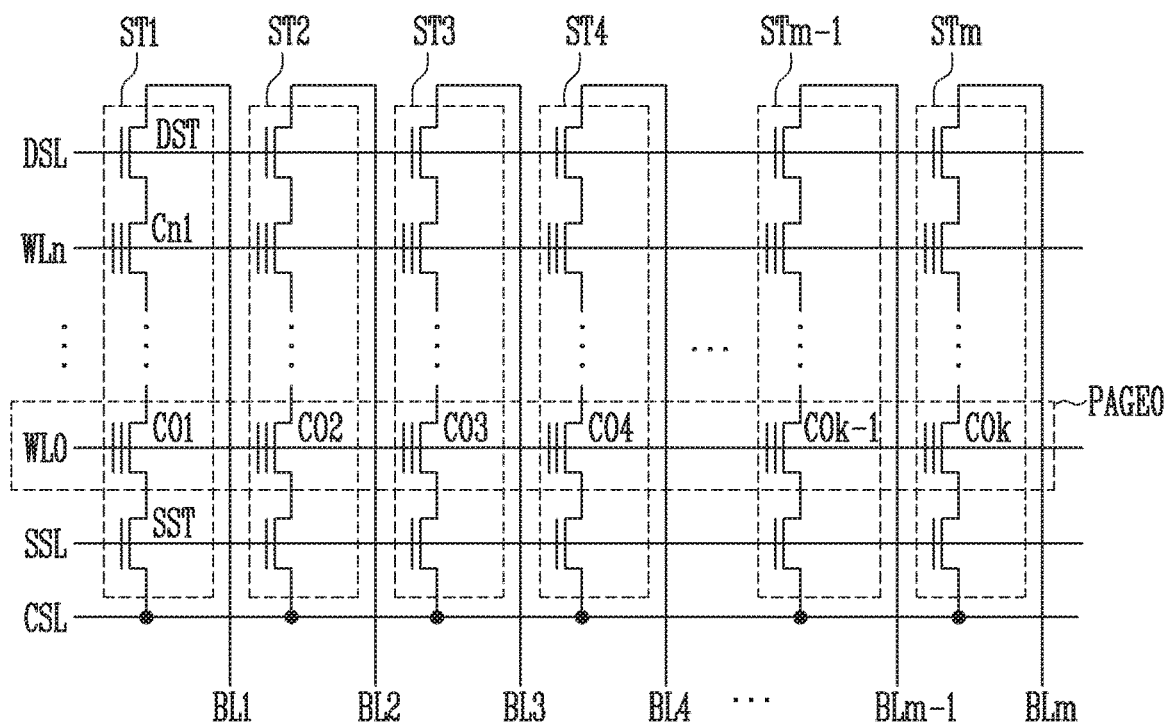
FIG. 4 is a circuit diagram illustrating a memory block in accordance with an embodiment of the present disclosure.

FIG. 4 is a circuit diagram illustrating a memory block in accordance with an embodiment of the present disclosure, for example, the memory block shown in FIG. 3.

Referring to FIG. 4, each memory block includes a plurality of strings ST1 to STm coupled between bit lines BL1 to BLm and a common source line CSL. That is, the strings ST1 to STm are coupled to corresponding bit lines BL1 to BLm, respectively, and are commonly coupled to the common source line CSL. Each string ST1 includes a source select transistor SST having a source coupled to the common source line CSL, a plurality of memory cells C01 to Cn1, and a drain select transistor DST having a drain coupled to the bit line BL1. The memory cells C01 to Cn1 are coupled in series between the select transistors SST and DST. A gate of the source select transistor SST is coupled to a source select line SSL. Gates of the memory cells C01 to Cn1 are coupled to word lines WL0 to WLn, respectively. A gate of the drain select transistor DST is coupled to a drain select line DSL.

Memory cells included in a memory block may be divided in units of physical pages or logical pages. For example, memory cells C01 to C0$k$ coupled to one word line (e.g., WL0) constitute one physical page PAGE0. Such a page becomes a basic unit of the program operation or the read operation.

Figure 5:
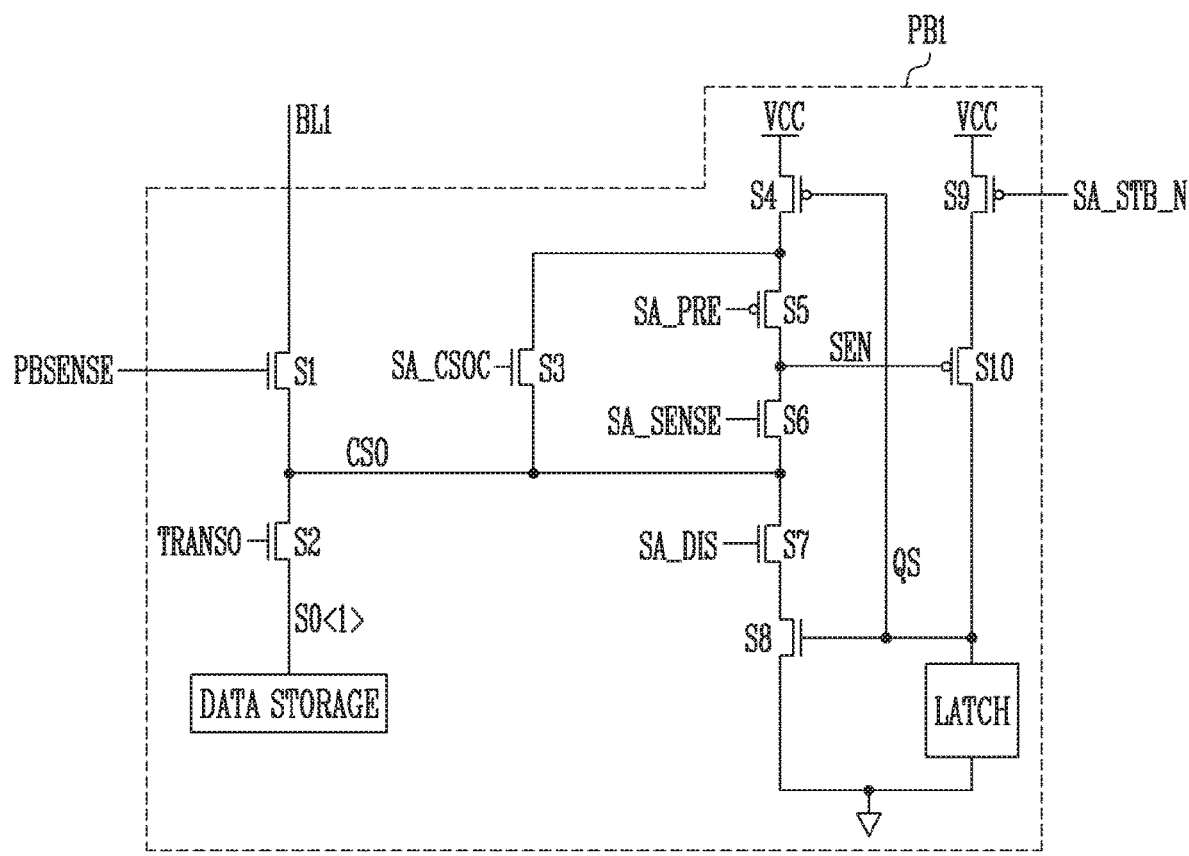
FIG. 5 is a circuit diagram illustrating a page buffer in accordance with an embodiment of the present disclosure.

FIG. 5 is a circuit diagram illustrating a page buffer in accordance with an embodiment of the present disclosure, for example, the page buffer PB of FIG. 2.

Since first to mth page buffers PB1 to PBm shown in FIG. 2 are configured identically, a first page buffer PB1, among the first to mth page buffers PB1 to PBm, is illustrated in FIG. 5 as an example of one of the page buffers.

Referring to FIG. 5, the first page buffer PB1 is coupled to a first bit line BL1. The first page buffer PB1 may include first to tenth switches S1 to S10. Signals PBSENSE, TRANSO, SA_CSOC, SA_PRE, SA_SENSE, SE_DIS, and SA_STB_N for controlling the first to tenth switches S1 to S10 may be included in the page buffer control signals PBSIGNALS.

The first switch S1 may be implemented with an NMOS transistor for coupling the bit line BL1 to a first current sensing node CSO in response to a sensing signal PBSENSE being applied to S1. The second switch S2 may be implemented as an NMOS transistor for coupling the first current sensing node CSO to a sensing node SO<1> in response to a transmission signal TRANSO being applied to S2. The sensing node SO<1> may be coupled to a data storage, and be coupled to the current sensing circuit 260 of FIG. 2 in a sensing operation performed in a verify operation and a read retry operation. In the sensing operation, a voltage applied to the sensing node SO<1> may be transferred to the current sensing circuit 260 of FIG. 2. For example, in the sensing operation, the sensing nodes SO<m:1> of the first to mth page buffers PB1 to PBm are commonly coupled to the current sensing circuit 260.

The third switch S3 may be implemented with an NMOS transistor for coupling a node coupled between the fourth switch S4 and the fifth switch S5 to the first current sensing node CSO in response to a precharge transmission signal SA_CSOC being applied to S3. The fourth switch S4 may be implemented with a PMOS transistor for coupling a terminal for a power supply voltage VCC to the fifth switch S5 according to a potential of a data node QS. The data node QS may be varied depending on data stored in a latch, and be initialized to low. The fifth switch S5 may be implemented with a PMOS transistor for transferring a power supply voltage VCC transferred through the fourth switch S4 to a second current sensing node SEN in response to a precharge signal SA_PRE being applied to S5. The sixth switch S6 may be implemented with an NMOS transistor for coupling the second current sensing node SEN to the first current sensing node CSO in response to a sensing transfer signal SA_SENSE being applied to S6.

The seventh switch S7 may be implemented with an NMOS transistor for coupling the first current sensing node CSO to the eighth switch S8 in response to a discharge signal SA_DIS being applied to S7. The eighth switch S8 may be implemented with an NMOS transistor for coupling the seventh switch S7 to a ground terminal in response to the potential of the data node QS coupled to the latch.

The ninth switch S9 may be implemented with a PMOS transistor for coupling the power terminal VCC to the tenth switch S10 in response to a strobe signal SA_STB_N being applied to S9. The tenth switch S10 may be implemented with a PMOS transistor for forming a current path between the ninth switch S9 and the latch in response to a potential of the second current sensing node SEN.

An operation of the first page buffer PB1 will be described as follows.

Before the sensing operation of the first page buffer PB1 is performed, a precharge operation for precharging the first bit line BL1 to a positive voltage may be performed. In the precharge operation, data having a logic low level (e.g., data '0') may be stored in the latch. The data node QS may be initialized to have a logic low level by the data '0.' When the potential of the data node QS is low, the fourth switch S4 may be turned on. When the third and first switches S3 and S1 are turned on in response to the precharge transmission signal SA_CSOC and the sensing signal PBSENSE, respectively, a current path may be formed through the fourth, third, and first switches S4, S3, and S1. Therefore, the first bit line BL1 and the terminal for the power supply voltage VCC are coupled to each other, so that the first bit line BL1 may be precharged to a positive voltage. The method for precharging the first bit line BL1 may be performed in various ways in addition to the above-described method.

When the first bit line BL1 is precharged, the third and fifth switches S3 and S5 are turned off in response to the precharge transmission signal SA_CSOC and the sensing signal PBSENSE, respectively, and therefore, the supply of the precharge voltage to the first current sensing node CSO may be stopped. Subsequently, when a verify voltage is applied to a selected word line, the potential of the first bit line BL1 may be maintained at a precharge level or be lowered according to a threshold voltage of a memory cell coupled to the selected word line. Subsequently, a sensing operation for sensing the potential of the first bit line BL1 may be performed.

In the sensing operation, the first to sixth switches S1 and S6 are turned on, and hence the tenth switch S10 may be turned on or turned off according to a potential of the first current sensing node CSO. Subsequently, when the ninth switch S9 is turned on in response to the strobe signal SA_STB_N, the data stored in the latch is maintained as previous data or is changed, based on whether the tenth switch S10 is turned on or turned off. Subsequently, the first current sensing node CSO is initialized to have a ground voltage level (i.e., 0).

The fourth switch S4 is turned on or turned off according to the data stored in the latch, and the third switch S3 is turned on in response to the precharge transmission signal SA_CSOC, so that the potential of the first current sensing node CSO is precharged to a power supply voltage level (i.e., VCC) or is maintained at the ground voltage level according to the data stored in the latch. Subsequently, the second switch S2 is turned on in response to the data transmission signal TRANSO, and the potential of the first current sensing node CSO is transferred to the sensing node SO<1>, so that the data is transmitted to the data storage.

Figure 6:
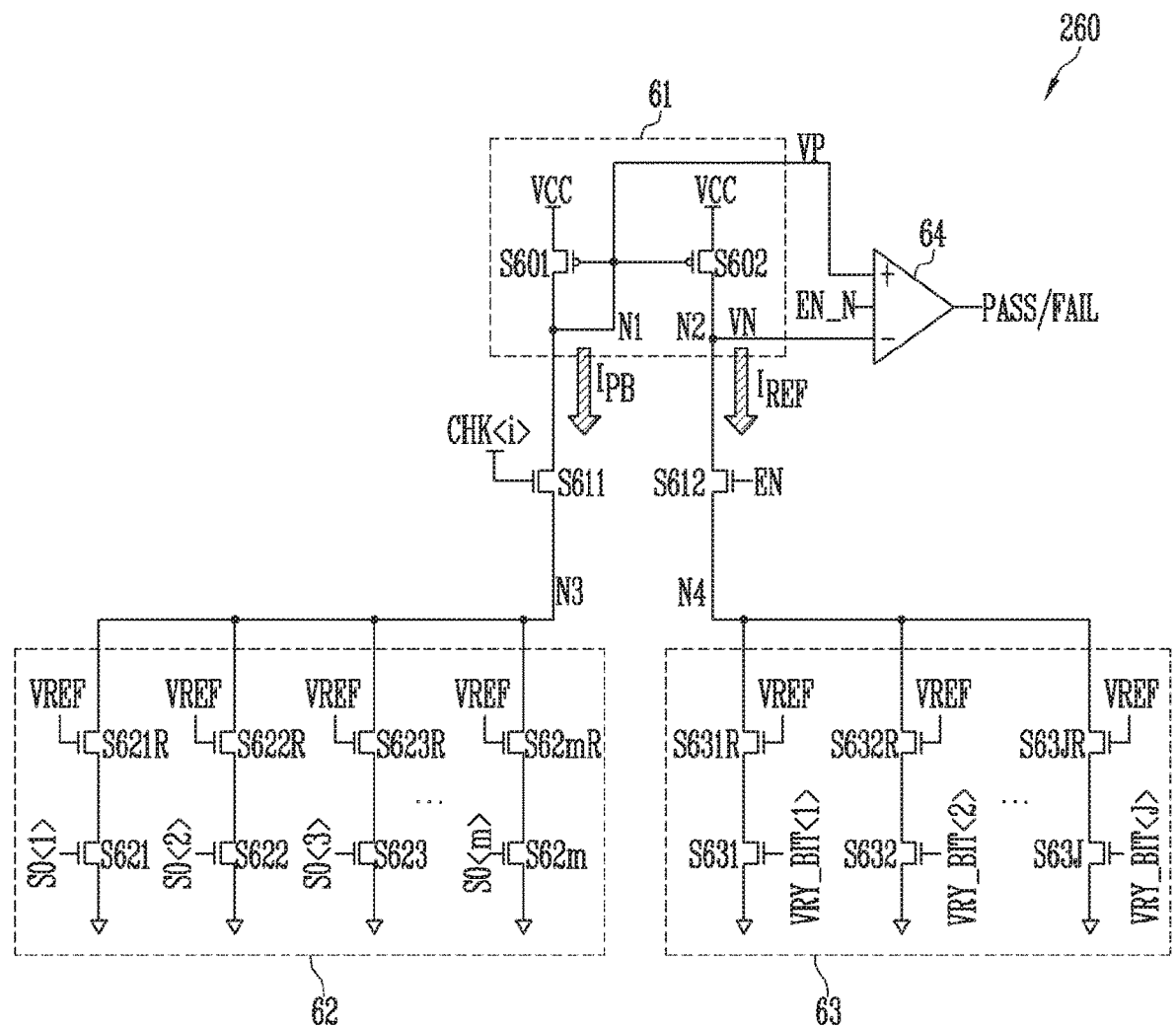
FIG. 6 is a circuit diagram illustrating a current sensing circuit in accordance with an embodiment of the present disclosure.

FIG. 6 is a circuit diagram illustrating a current sensing circuit in accordance with an embodiment of the present disclosure, for example, the current sensing circuit 260 of FIG. 2.

Referring to FIG. 6, in a verify operation, the current sensing circuit 260 may output the pass signal PASS or the fail signal FAIL based on the number of failed bits. When the number of failed bits is less than or equal to an allowed bit number, the current sensing circuit 260 may output the pass signal PASS. When the number of failed bits exceeds the allowed bit number, the current sensing circuit 260 may output the fail signal FAIL. The number of failed bits may be determined according to the potential levels of the sensing nodes SO<m:1> of the first to mth page buffers PB1 to PBm of FIG. 2. The allowed bit number may be determined according to the allow bit VRY_BIT<#> received from the control logic 300 of FIG. 2.

In a read retry operation, the current sensing circuit 260 may output the pass signal PASS or the fail signal FAIL by determining whether the number of first data (e.g., data '0') among data read by the first to mth page buffers PB1 to PBm of FIG. 2 is greater than a first set number. In the read retry operation, the current sensing circuit 260 may output the pass signal PASS or the fail signal FAIL by determining whether the number of first data (e.g., data '0') among the data read by the first to mth page buffers PB1 to PBm of FIG. 2 is less than a second set number. The number of first data may be determined according to the potential levels of the sensing nodes SO<m:1> of the first to mth page buffers PB1 to PBm of FIG. 2. The first set number or the second set number may be determined according to the allow bit VRY_BIT<#> received from the control logic 300 of FIG. 2.

The current sensing circuit 260 will be described in detail as follows.

The current sensing circuit 260 may include a voltage generator 61, a chunk enable switch S611, an enable switch S612, a fail bit counter 62, an allow bit counter 63, and a comparator 64.

The voltage generator 61 may generate a pass voltage VP and a fail voltage VN according to a sensing current IPB and a reference current IREF. For example, the voltage generator 61 may generate the fail voltage VN greater than the pass voltage VP when the sensing current IPB increases, and generate the pass voltage VP greater than the fail voltage VN when the sensing current IPB decreases. To this end, the voltage generator 61 may include first and second switches S601 and S602. The first switch S601 is coupled between a terminal to which a power supply voltage VCC is applied and a first node N1, and may be implemented with a PMOS transistor that is turned on or turned off in response to a voltage of the first node N1.

The second switch S602 is coupled between the terminal to which the power supply voltage VCC is applied and a second node N2, and may be implemented with a PMOS transistor that is turned on or turned off in response to the voltage of the first node N1. A current flowing through the first node N1 becomes the sensing current IPB, and the voltage of the first node N1 becomes the pass voltage VP. A current flowing through the second node N2 becomes the reference current IREF, and a voltage of the second node N2 becomes the fail voltage VN. Therefore, when the sensing current IPB increases, the pass voltage VP decreases. When the sensing current IPB decreases, the pass voltage VP increases. In addition, when the reference current IREF increases, the fail voltage VN decreases. When the reference current IREF decreases, the fail voltage VN increases.

The chunk enable switch S611 is coupled between the first node N1 and a third node N3. The chunk enable switch S611 may be implemented with an NMOS transistor that is turned on or turned off in response to a chunk voltage CHK<i>, which may be a voltage of internal nodes of the page buffers, which are divided in units of chunks.

The enable switch S612 is coupled between the second node N2 and a fourth node N4. The enable switch S612 may be implemented with an NMOS transistor that is turned on or turned off in response to an enable signal EN for a pass/fail determination operation.

The fail bit counter 62 may be configured to vary a current of the third node N3 according to voltages transferred through the sensing nodes SO<m:1> of the page buffers. The fail bit counter 62 may include a plurality of fail bit reference switches S621R to S62mR and a plurality of fail bit switches S621 to S62m. The fail bit reference switches S621R to S62mR may be coupled in parallel to the third node N3 while respectively forming pairs with the fail bit switches S621 to S62m. For example, a first fail bit reference switch S621R and a first fail bit switch S621 may be coupled in series between the third node N3 and a ground terminal. In this manner, an mth fail bit reference switch S62mR and an mth fail bit switch S62m may be coupled in series between the third node N3 and the ground terminal. The plurality of fail bit reference switches S621R to S62mR may be implemented with NMOS transistors that are commonly turned on or turned off in response to a reference voltage VREF. Gates of the plurality of fail bit switches S621 to S62m may be coupled to the sensing nodes SO<m:1> of the page buffers, respectively. When the voltage of the sensing nodes SO<m:1> has a high level, this may indicate a failed bit number. Alternatively, when the voltage of the sensing nodes SO<m:1> has a high level, this may indicate the first data. The plurality of fail bit switches S621 to S62m may be implemented with NMOS transistors that are turned on when high voltages are applied to the gates of the plurality of fail bit switches S621 to S62m. Therefore, when the fail bit number or the first data increases, the number of turned-on fail bit switches S621 to S62m may increase. When the number of turned-on fail bit switches S621 to S62m increases, the current flowing through the third node N3 may increase.

The allow bit counter 63 may be configured to constantly maintain a current of the fourth node N4 according to a set allow bit VRY_BIT<#>. That is, although the current of the fourth node N4 is varied depending on the allow bit VRY_BIT<#>, the allow bit VRY_BIT<#> is constantly maintained, and hence the current flowing through the fourth node N4 may be constantly maintained. The allow bit VRY_BIT<#> may be differently set according to the memory device, by considering error correction code (ECC) ability in the verify operation. Also, the allow bit VRY_BIT<#> may be differently set according to the first set number and/or the second set number in the read retry operation. The allow bit counter 63 may include a plurality of allow bit reference switches S631R to S63JR and a plurality of allow bit switches S631 to S631. The allow bit reference switches S631R to S63JR may be coupled in parallel to the fourth node N4 while respectively forming pairs with the allow bit switches S631 to S633. For example, a first allow bit reference switch S631R and a first allow bit switch S631 may be coupled in series between the fourth node N4 and the ground terminal. In this manner, a Jth allow bit reference switch S63JR and a Jth allow bit switch S633 may be coupled in series between the fourth node N4 and the ground terminal. The plurality of allow bit reference switches S631R to S633R may be implemented with NMOS transistors that are commonly turned on or turned off in response to the reference voltage VREF. Gates of the plurality of allow bit switches S631 to S633 may be implemented with NMOS transistors that are turned on or turned off in response to allow bits VRY_BIT<J:1> received from the control logic 300. Therefore, when the allow bit number increases, the number of turned-on allow bit switches S631 to S633 may increase. When the number of turned-on allow bit switches S631 to S633 increases, the current flowing through the fourth node N4 may also increase.

As described above, while the current of the fourth node N4 is constantly maintained according to the allow bits VRY_BIT<J:1>, the current of the third node N3 is varied depending on the number of fail bits or first data detected by the page buffer group 230 of FIG. 2. Therefore, when both of the chunk enable switch S611 and the enable switch S612 are turned on, the sensing current IPB and the pass voltage VP are generated according to the current of the third node N3, and the reference current IREF and the fail voltage VN are generated according to the current of the fourth node N4.

The comparator 64 may compare the pass voltage VP and the fail voltage VN in response to an enable reverse signal EN_N, and may output the pass signal PASS or the fail signal FAIL, based on the comparison result. For example, the pass voltage VP may be applied to a non-inverting terminal (+) of the comparator 64, and the fail voltage VN may be applied to an inverting terminal (−).

In the read retry operation, the comparator 64 outputs the pass signal PASS having a low level when the number of first data is greater than or equal to the first set number, and outputs the fail signal FAIL having a high level when the number of first data is less than the first set number. Also, in the read retry operation, the comparator 64 outputs the pass signal PASS having a high level when the number of first data is less than or equal to the second set number, and outputs the fail signal FAIL having a low level when the number of first data is greater than the second set number.

Figure 7:
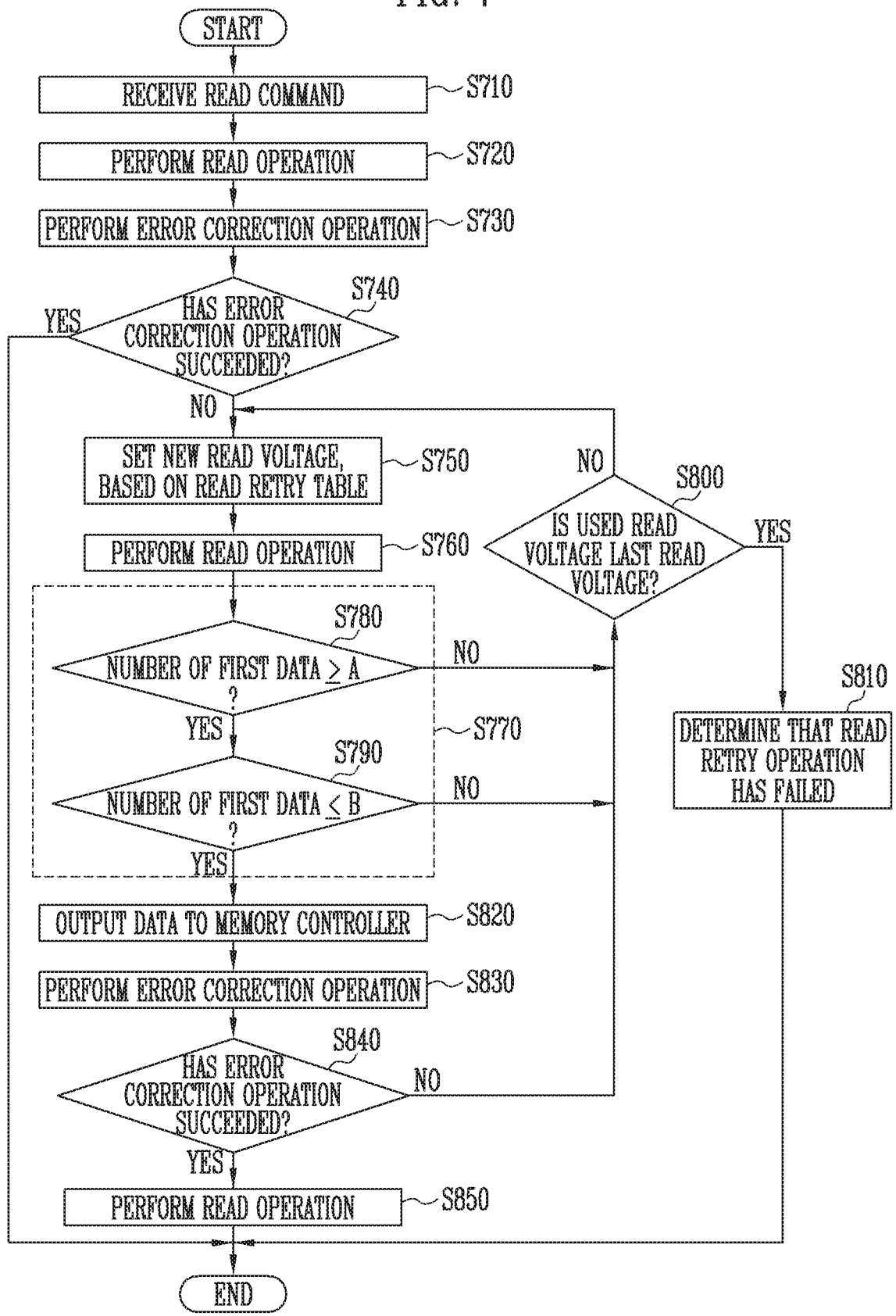
FIG. 7 is a flowchart illustrating an operating method of the memory system in accordance with an embodiment of the present disclosure.

FIG. 7 is a flowchart illustrating an operating method of a memory system in accordance with an embodiment of the present disclosure.

Figure 8A:
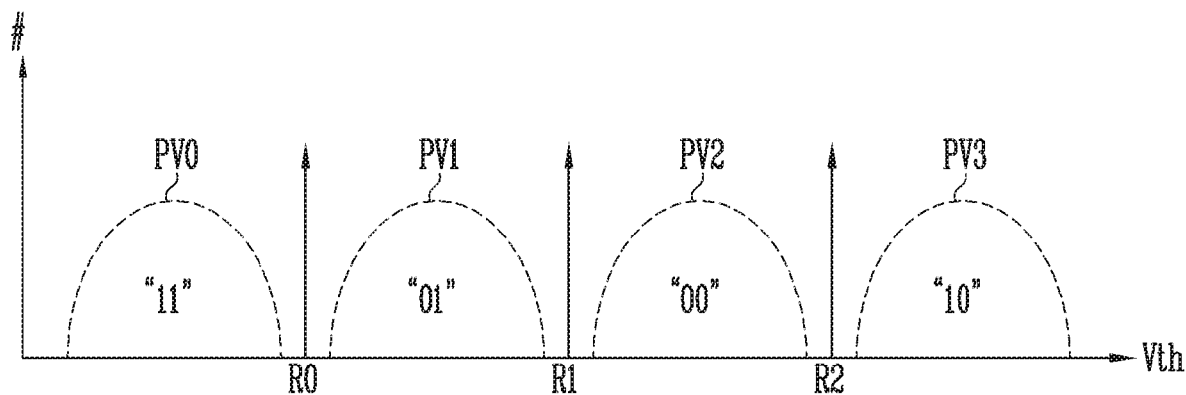
FIG. 8A is a graph illustrating exemplary threshold voltage distributions of memory cells.

FIG. 8A is a graph illustrating exemplary threshold voltage distributions of memory cells.

Figure 8B:
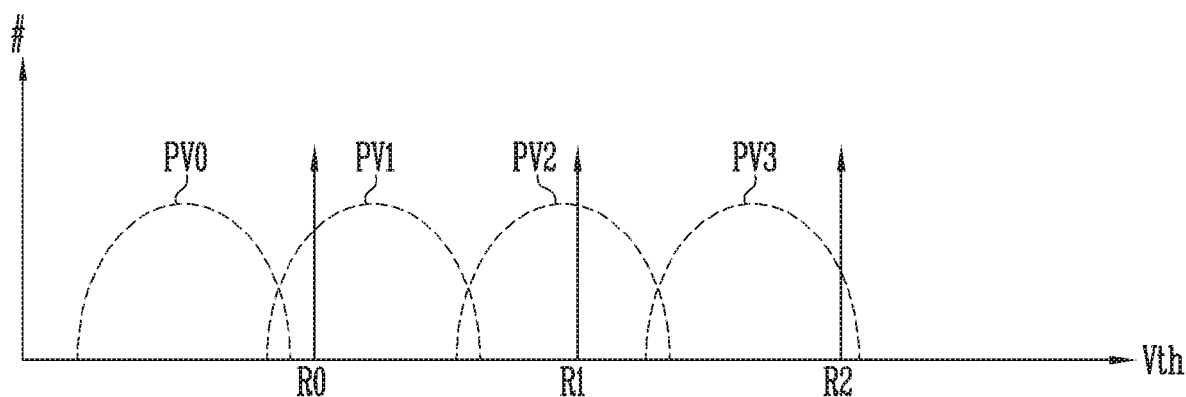
FIG. 8B is a graph illustrating movement of the threshold voltage distributions.

FIG. 8B is a graph illustrating movement of the threshold voltage distributions.

The operating method of the memory system in accordance with an embodiment of the present disclosure will be described as follows with reference to FIGS. 1 to 8B, but primarily FIG. 7.

Referring to FIG. 7, when a request corresponding to a read operation is received from the host 2000 (S710), the processor 1220 of the memory controller 1200 provides a command CMD corresponding to the read operation to the memory device 1100. The processor 1220 translates a logical address included in the request corresponding to the read operation into a physical address, and provides the memory device 1100 with the translated address ADD together with the command CMD corresponding to the read operation CMD.

The memory device 1100 performs the read operation in response to the command CMD and the address ADD, which are received from the memory controller 1200 (S720).

In the read operation, the control logic 300 controls the peripheral circuit 200 to perform the read operation by generating an operation signal OP_CMD, a row address RADD, and page buffer control signals PBSIGNALs in response to the command CMD and the address ADD. The voltage generation circuit 210 generates a read voltage and a pass voltage in response to the operation signal OP_CMD. The row decoder 220 applies the read voltage to a selected word line (e.g., WL0) of a selected memory block and applies the pass voltage to the other word lines (e.g., WL1 to WLn) in response to the row address RADD. The page buffers PB1 to PBm of the page buffer group 230 read data stored in memory cells C01 to C0k included in a selected page PAGE0 by sensing voltages or currents of the corresponding bit lines BL1 to BLm in response to the page buffer control signals PBSIGNALS. The read data DATA is output to the memory controller 1200 through the column decoder 240 and the input/output circuit 250.

FIG. 8A is a graph illustrating exemplary threshold voltage distributions PV0 to PV3 of memory cells. Referring to FIG. 8, the horizontal axis denotes threshold voltages of memory cells (Vth), and the vertical axis denotes numbers of memory cells (#) with respect to threshold voltages. The memory cells may have certain threshold voltage distributions PV0 to PV3 according to data stored therein. When a memory cell stores, for example, data of two bits, i.e., "11," "01," "00" or "10," the memory cell may be controlled to have a threshold voltage corresponding to any one of the four threshold voltage distributions PV0 to PV3 according to data stored therein. In a program operation of the memory device, data randomized by the memory controller 1200 are programmed. Therefore, two-bit data, i.e., "11," "01," "00" or "10," is stored in each memory cell.

In a read operation, the memory device 1100 reads data stored in a memory cell, using the first to third read voltages R0, R1, and R2. Data stored in the memory cell may be determined based on the data read from the memory cell in response to each of the first to third read voltages R0, R1, and R2. For example, "0" may be read with respect to the read voltage R1 from a memory cell forming the threshold voltage distribution PV2, and "0" may be read with respect to the read voltage R2 from the memory cell forming the threshold voltage distribution PV2. Data stored in the corresponding memory cell may be determined as "00," based on the read data. The read voltages R0 to R2 may be respectively located between the threshold voltage distributions PV0 to PV3 such that the threshold voltage distributions PV0 to PV3 can be distinguished from one another to read data stored in memory cells.

Referring again to FIG. 7, the error correction block 1230 of the memory controller 1200 corrects an error by decoding the data DATA received from the memory device 1100 according to an error correction code (S730).

Referring to FIG. 8B, threshold voltages of memory cells may change for various reasons such as interference between adjacent memory cells and discharge caused by lapse of time, and therefore, the threshold voltage distributions PV0 to PV3 may move such that adjacent distributations overlap. As a result, the first to third read voltages R0, R1, and R2 may not be located between the threshold voltage distributions PV0 to PV3, and data read from the memory cells may include error bits. When the read data includes error bits exceeding the error correction ability of the error correction block 1230, the error correction block 1230 may fail in an error correction operation.

Referring again to FIG. 7, the processor 1220 determines whether the error correction operation performed by the error correction block 1230 has succeeded (S740). When it is determined that the error correction operation has succeeded (S740, YES), the error-corrected data is output to the host 2000, thereby ending the read operation.

When it is determined that the error correction operation has failed (S740, NO), the processor 1220 controls the memory device 1100 to perform a read retry operation. The control logic 300 of the memory device 1100 sets a new read voltage by receiving information from the read retry table stored in the RAM 1210 of the memory controller 1200 (S750). The new read voltage may be a voltage that is increased or decreased by an offset voltage relative to a previous read voltage.

The control logic 300 controls the peripheral circuit 200 to perform a read operation using the newly set read voltage (S760). The read operation is similar to that in the step S720 described above, and therefore, its detailed description is omitted here.

The control logic 300 performs a data number comparison operation (S770) of determining whether the number of data read by the read operation (S760) is equal. The data number comparison operation S770 includes an operation of determining whether the number of data '0' (i.e., data having a logic low level) or the number of data '1' (i.e., data having a logic high level) read using a specific read voltage (e.g., a second read voltage) is included in a set range (A or B) or is out of the set range.

The current sensing circuit 260 outputs a pass signal PASS or a fail signal FAIL by determining whether the number of first data among data sensed by the page buffer group 230 is greater than or equal to a first set number A (S780). The first data may be data '0' or data '1' read using the second read voltage among newly set read voltages. The second read voltage divides the plurality of threshold voltage distributions into two parts. When a read operation is performed using the second read voltage, it may be determined that the read operation has been normally performed only when the number of memory cells having threshold voltages PV0 and PV1 (data '1') less than the second read voltage is equal to that of memory cells having threshold voltages PV2 and PV3 (data '0') greater than the second read voltage.

The number of first data may be determined according to the potential levels of the sensing nodes SO<m:1> of the first to mth page buffers PB1 to PBm of FIG. 2. The first set number A may be determined according to the allow bit VRY_BIT<#> received from the control logic 300. In an example, the first set number A may be 40% of the number (m) of memory cells included in one page.

When it is determined that the number of first data is less than the first set number A as a result of the determination operation using the current sensing circuit 260 (S780, NO), it is determined that the reliability of data read using the read voltages newly set in the read retry operation has not been ensured, and it is determined whether the used read voltage is the last read voltage of the read retry table (S800). When it is determined that the used read voltage is not the last read voltage (S800, NO), the memory device 1100 proceeds to the step S750 to re-perform the above-described steps. When it is determined that the used read voltage is the last read voltage (S800, YES), it is determined that the read retry operation has failed (S810), and the read operation is ended.

When it is determined that the number of first data is greater than or equal to the first set number A as a result of the determination operation using the current sensing circuit 260 (S780, YES), the current sensing circuit 260 outputs the pass signal PASS or the fail signal FAIL by determining whether the number of first data among the data sensed by the page buffer circuit 230 is less than or equal to the second set number B. The second set number B may be determined according to the allow bit VRY_BIT<#> received from the control logic 300. In an example, the second set number B may be 60% of the number (m) of memory cells included in one page.

When the number of first data is greater than the second set number B as a result of the determination operation using the current sensing circuit 260 (S790, NO), it is determined that the reliability of data read using the read voltages newly set in the read retry operation has not been ensured, and it is determined whether the used read voltage is the last read voltage of the read retry table (S800). When it is determined that the used read voltage is not the last read voltage (S800, NO), the memory device 1100 proceeds to the step S750 to re-perform the above-described steps. When it is determined that the used read voltage is the last read voltage (S800, YES), it is determined that the read retry operation has failed (S810), and the read operation is ended.

When the number of first data is less than or equal to the second set number B as a result of the determination operation (S790) using the current sensing circuit 260 (S790, YES), it is determined that the reliability of data read using the read voltages newly set in the read retry operation has been ensured, and the read data are output to the memory controller 1200 (S820).

The error correction block 1230 of the memory controller 1200 corrects an error by decoding the data DATA received from the memory device 1100 according to an error correction code (S830).

The processor 1220 determines whether an error correction operation performed by the error correction block 1230 has succeeded (S840). When it is determined that the error correction operation has succeeded (S830, YES), it is determined that the read retry operation has succeeded (S850), and the read operation is ended by outputting the error-corrected data to the host 2000.

When it is determined that the error correction operation has failed (S840, NO), the processor 1220 controls the memory device 1100 to re-perform the above-described steps from the step S800.

The current sensing circuit 260 may output the pass signal PASS or the fail signal FAIL by determining whether the number of data is included in the set range or is out of the set range. For example, when it is determined that the number of specific data is included in the set range, the current sensing circuit 260 may generate and output the pass signal PASS. When it is determined that the number of specific data is out of the set range, the current sensing circuit 260 may generate and output the fail signal FAIL.

As described above, in accordance with embodiments of the present disclosure, the reliability of read data is determined according to whether the number of specific data is included in the set range before data read in the read retry operation are output to the memory controller, and only read data of which reliability is ensured are output to the memory controller, so that an unnecessary data transmission operation and an unnecessary error correction operation may be prevented.

Figure 9:
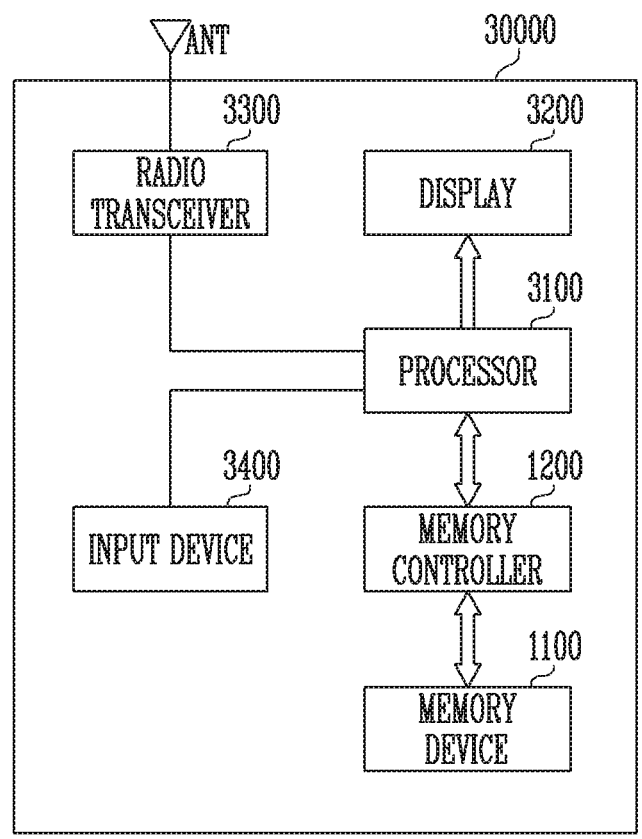
FIG. 9 is a diagram illustrating an exemplary memory system to which aspect of the present invention may be applied.

FIG. 9 is a diagram illustrating a memory system 30000 in accordance with an embodiment of the present disclosure.

Referring to FIG. 9, the memory system 30000 may be implemented as a cellular phone, a smart phone, a tablet personal computer (PC), a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit and receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100. Also, the memory controller 1200 may be implemented with the memory controller shown in FIG. 1, and the memory device 1100 may be implemented with the memory device shown in FIG. 1.

Figure 10:
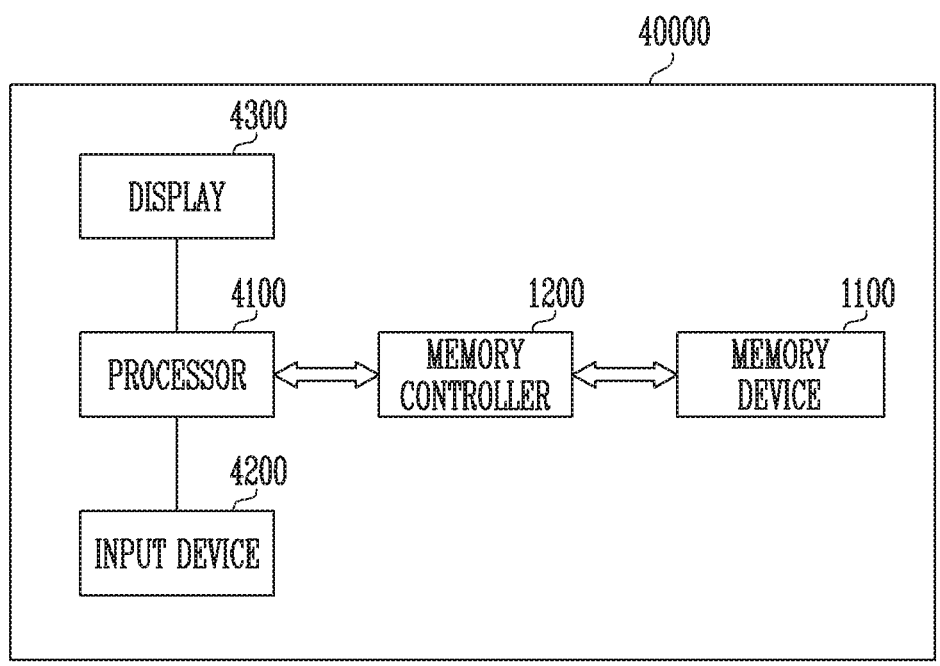
FIG. 10 is a diagram illustrating another example of a memory system to which aspect of the present invention may be applied.

FIG. 10 is a diagram illustrating a memory system 40000 in accordance with an embodiment of the present disclosure.

Referring to FIG. 10, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 is implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100. Also, the memory controller 1200 may be implemented with the memory controller shown in FIG. 1, and the memory device 1100 may be implemented with the memory device shown in FIG. 1.

Figure 11:
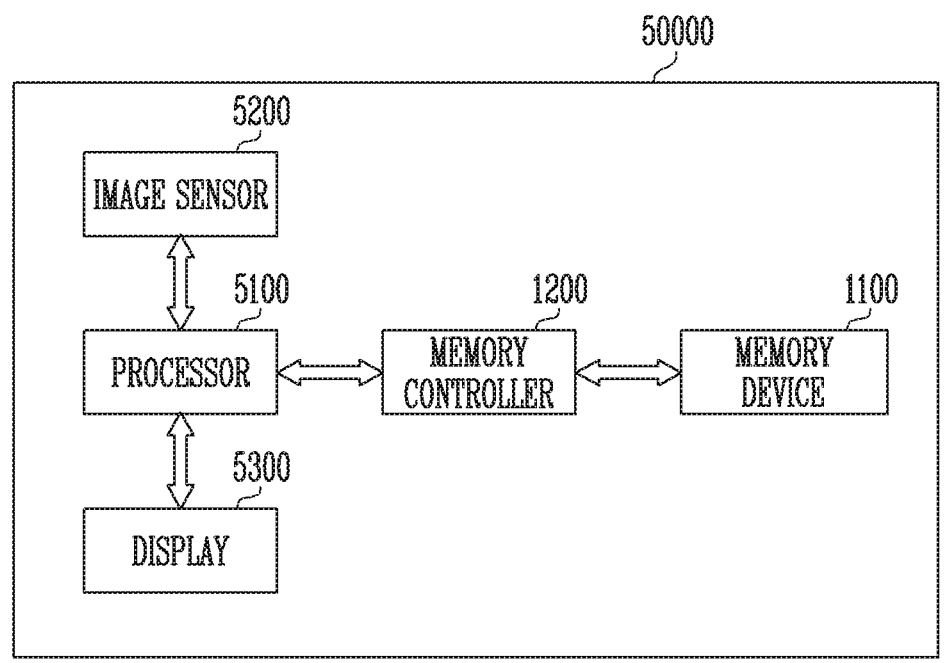
FIG. 11 is a diagram illustrating another example of a memory system to which aspect of the present invention may be applied.

FIG. 11 is a diagram illustrating a memory system 50000 in accordance with an embodiment of the present disclosure.

Referring to FIG. 11, the memory system 50000 may be implemented as an image processing device, e.g., a digital camera, a mobile terminal having a digital camera attached thereto, a smart phone having a digital camera attached thereto, or a tablet personal computer (PC) having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100. Also, the memory controller 1200 may be implemented with the memory controller shown in FIG. and the memory device 1100 may be implemented with the memory device shown in FIG. 1.

Figure 12:
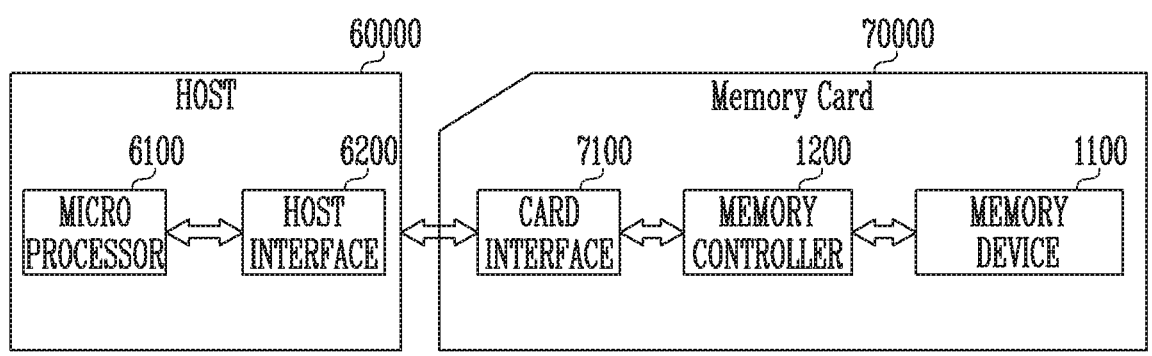
FIG. 12 is a diagram illustrating another example of a memory system to which aspect of the present invention may be applied.

FIG. 12 is a diagram illustrating a memory system 70000 in accordance with an embodiment of the present disclosure.

Referring to FIG. 12, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a personal computer (PC), a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100. In addition, the memory controller 1200 may be implemented with the memory controller shown in FIG. and the memory device 1100 may be implemented with the memory device shown in FIG. 1.

In accordance with embodiments of the present disclosure, only data of which reliability is ensured in a read retry operation is output to the memory controller. Thus, the number of times of outputting data to the memory controller can be decreased, and the number of times where the memory controller performs an error correction operation can be decreased.

Various embodiments have been disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
   a memory device configured to perform a read operation and to output data obtained from the read operation; and
   a memory controller configured to perform an error correction operation on the data obtained from the read operation and to control the memory device to perform a read retry operation, based on a result of the error correction operation,
   wherein the memory device outputs data obtained from the read retry operation to the memory controller, if a number of logical high or a number of logical low in the data obtained from the read retry operation is between a first reference value and a second reference value greater than the first reference value.

2. The memory system of claim 1, wherein the memory device includes:
   a memory block configured to store data;
   a peripheral circuit configured to perform a program operation and the read operation on the memory block; and
   control logic configured to control the peripheral circuit to perform the program operation and the read operation, and to perform the read retry operation using read voltages set according to information in a read retry table.

3. The memory system of claim 2, wherein the peripheral circuit includes a current sensing circuit configured to output a first pass signal or a first fail signal based on determining whether the number of logical high or the number of logical low included in data obtained using a specific read voltage, among the read voltages for the read retry operation, is greater than or equal to the first reference value, and output a second pass signal or a second fail signal based on determining whether the number of logical high or the number of logical low included in the data obtained using the specific read voltage is less than or equal to the second reference value.

4. The memory system of claim 3, wherein the control logic determines whether the number of logical high or the number of logical low is between the first reference value and the second reference value according to the first pass signal, the first fail signal, the second pass signal or the second fail signal.

5. A memory system comprising:
   a memory device configured to store random data; and
   a memory controller configured to convert write data into the random data, and to output the random data to the memory device,
   wherein the random data includes a plurality of data chunks, and
   wherein the plurality of data chunks included in the random data have a same number, respectively.

6. The memory system of claim 5, wherein the memory device performs a program operation to store the random data in memory cells, and
   wherein the memory cells are programmed to have one of a plurality of threshold voltage distributions respectively corresponding to the plurality of data chunks.

7. The memory system of claim 3, wherein the specific read voltage has a voltage level between two adjacent threshold voltage distributions, among a plurality of threshold voltage distributions.

8. The memory system of claim 1, wherein the logical low indicates first data('0') and the logical high indicates second data('1').

9. The memory system of claim 2, wherein, if the number of logical high or the number of logical low in the data obtained from the read retry operation is less than the first reference value or greater than the second reference value, the control logic controls the peripheral circuit to re-perform the read retry operation using newly set read voltages according to the read retry table.

10. A memory system comprising:
   a memory device configured to perform a read operation and to output data obtained from the read operation; and
   a memory controller configured to perform an error correction operation on the data obtained from the read operation and to control the memory device to perform a first read retry operation, based on a result of the error correction operation,
   wherein, if a number of logical high or a number of logical low in data obtained from the first read retry operation is less than a first reference value or greater than a second reference value, the memory device performs a second read retry operation without outputting the data obtained from the first read retry operation to the memory controller.

11. The memory system of claim 10, wherein the memory device includes:
   a memory block configured to store data;
   a peripheral circuit configured to perform a program operation and the read operation on the memory block; and
   control logic configured to control the peripheral circuit to perform the program operation and the read operation, and control the peripheral circuit to perform the first read retry operation using read voltages set according to information in a read retry table.

12. The memory system of claim 11, wherein the peripheral circuit includes a current sensing circuit configured to output a first pass signal or a first fail signal based on determining whether the number of logical high or the number of logical low included in data obtained using a specific read voltage, among the read voltages for the first read retry operation, is greater than or equal to the first reference value, and output a second pass signal or a second fail signal based on determining whether the number of logical high or the number of logical low included in the data obtained using the specific read voltage is less than or equal to the second reference value.

13. The memory system of claim 11, wherein the memory device programs each of memory cells in the memory block to have any one of a plurality of threshold voltage distributions in the program operation.

14. The memory system of claim 12, wherein the specific read voltage has a voltage level between two adjacent threshold voltage distributions, among a plurality of threshold voltage distributions.

15. The memory system of claim 10, wherein the logical low indicates first data('0') and the logical high indicates second data('1').

16. The memory system of claim 10, wherein the memory device outputs the data obtained from the first read retry operation to the memory controller if the number of logical high or the number of logical low in the data obtained from the first read retry operation is between the first reference value and the second reference value.

17. A method for operating a memory device, the method comprising:
   performing a read retry operation using a read retry voltage; and
   outputting data obtained from the read retry operation to a memory controller in response to a number of logical high or a number of logical low in the data obtained from the read retry operation being between a first reference value and a second reference value.

18. A method for operating a memory device, the method comprising:
   performing a first read retry operation using a first read retry voltage; and
   performing a second read retry operation in response to a number of logical high or a number of logical low in data obtained from the first read retry operation is less than a first reference value or greater than a second reference value without outputting the data obtained from the first read retry operation to an external controller.

19. The method of claim 17, wherein the data obtained from the read retry operation includes a plurality of data chunks, and wherein a number of each data chunk is the same.

* * * * *